United States Patent
Zhu et al.

(10) Patent No.: US 9,252,280 B2
(45) Date of Patent: Feb. 2, 2016

(54) MOSFET AND METHOD FOR MANUFACTURING THE SAME

(75) Inventors: Huilong Zhu, Poughkeepsie, NY (US); Miao Xu, Beijing (CN); Qingqing Liang, Lagrangeville, NY (US)

(73) Assignee: Institute of Microelectronics, Chinese Academy of Sciences (CN)

(*) Notice: Subject to any disclaimer, the term of this patent is extended or adjusted under 35 U.S.C. 154(b) by 707 days.

(21) Appl. No.: 13/510,461

(22) PCT Filed: Nov. 18, 2011

(86) PCT No.: PCT/CN2011/082424
§ 371 (c)(1),
(2), (4) Date: May 17, 2012

(87) PCT Pub. No.: WO2013/037167
PCT Pub. Date: Mar. 21, 2013

(65) Prior Publication Data
US 2013/0099315 A1    Apr. 25, 2013

(30) Foreign Application Priority Data
Sep. 16, 2011  (CN) .......................... 2011 1 0274852

(51) Int. Cl.
H01L 27/12     (2006.01)
H01L 29/786    (2006.01)
H01L 29/66     (2006.01)

(52) U.S. Cl.
CPC .... H01L 29/78648 (2013.01); H01L 29/66742 (2013.01); H01L 29/78609 (2013.01)

(58) Field of Classification Search
CPC ............ H01L 29/66742; H01L 29/786; H01L 29/78609; H01L 29/78648
See application file for complete search history.

(56) References Cited

U.S. PATENT DOCUMENTS 6,072,217 A * 6/2000 Burr .............................. 257/351
6,100,567 A   8/2000 Burr (Continued)

FOREIGN PATENT DOCUMENTS

CN    1909231 A    2/2007
JP    9-162417 A   6/1997

OTHER PUBLICATIONS

"International Application Serial No. PCT/CN2011/082424, International Search Report and Written Opinion mailed Jun. 21, 2012", 8 pgs.

*Primary Examiner* — Meiya Li
(74) *Attorney, Agent, or Firm* — Schwegman Lundberg & Woessner, P.A.

(57) ABSTRACT

The present disclosure discloses a metal-oxide-semiconductor field-effect transistor (MOSFET) and a method for manufacturing the same. The MOSFET includes: a silicon on insulator (SOI) wafer which comprises a semiconductor substrate, a buried insulating layer, and a semiconductor layer, the buried insulating layer being on the semiconductor substrate, and the semiconductor layer being on the buried insulating layer; a gate stack on the semiconductor layer; a source region and a drain region, which are in the semiconductor layer and on opposite sides of the gate stack; and a channel region, which is in the semiconductor layer and sandwiched by the source region and the drain region, wherein the MOSFET further comprises a back gate, the back gate being located in the semiconductor substrate and having a first doped region in a lower portion of the back gate and a second doped region in an upper portion of the back gate.

6 Claims, 6 Drawing Sheets

(56) References Cited

U.S. PATENT DOCUMENTS

| | | | |
|---|---|---|---|
| 6,930,361 B2 * | 8/2005 | Inaba | 257/408 |
| 7,573,077 B1 | 8/2009 | Ershov | |
| 7,732,864 B2 | 6/2010 | Kawahara et al. | |
| 7,943,996 B2 | 5/2011 | Kawahara et al. | |
| 2007/0029620 A1 | 2/2007 | Nowak | |

* cited by examiner

MOSFET AND METHOD FOR MANUFACTURING THE SAME

CROSS-REFERENCE TO RELATED APPLICATIONS

This application is National Phase application of, and claims priority to, PCT Application No. PCT/CN2011/082424, filed on Nov. 18, 2011, entitled "MOSFET AND METHOD FOR MANUFATURING THE SAME", which claimed priority to Chinese Application No. 201110274852.6, filed on Sep. 16, 2011. Both the PCT Application and Chinese Application are incorporated herein by reference in their entireries.

TECHNICAL FIELD

The present disclosure relates to a MOSFET and a method for manufacturing the same, and in particular, to a MOSFET with a back gate and a method for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the sizes of MOSFETs decrease. As the MOSFETs are scaled down, the gate also has a reduced effective length and actually controls fewer charges in the depletion region when a gate voltage is applied. Consequently, the threshold voltage of the MOSFETs drops with the reduced channel length.

In the MOSFETs, it may be desirable on the one hand that the threshold voltage of the semiconductor device is increased to suppress the short channel effects. On the other hand, it may also be desirable that the threshold voltage of the semiconductor device is decreased to reduce power consumption in a low supply voltage application, or in an application using both P-type and N-type MOSFETs. Moreover, an integrated circuit may comprise MOSFETs with different gate lengths. Although a high doping concentration in a back gate may be beneficial for the MOSFET with a small gate length for suppressing the short channel effects, it causes an excessively high threshold voltage for the MOSFET with a large gate length. It is desirable that the threshold voltages are adjusted differently for the MOSFETs with different gate lengths.

Channel doping is a known approach of tuning the threshold voltages. However, if the threshold voltage of the semiconductor device is raised by increasing a doping concentration in a channel region, the mobility of carriers will drop, which results in degradation of the device performance. Moreover, ions with a high doping concentration in the channel region may neutralize ions in source/drain regions and ions in regions which adjoin the channel region, which decreases the doping concentration in the region adjacent to the channel region and increases the resistance of the device.

Therefore, it is still desirable that the threshold voltage of the semiconductor device is adjusted in a controllable manner without increasing the doping concentration in the channel region, while the performance of the semiconductor device is not deteriorated.

SUMMARY OF THE DISCLOSURE

One object of the present disclosure is to provide a MOSFET having a threshold voltage adjustable by a back gate.

According to one aspect of the present disclosure, there is provided a MOSFET comprising a silicon on insulator (SOI) wafer, which comprises a semiconductor substrate, a buried insulating layer, and a semiconductor layer, the buried insulating layer being on the semiconductor substrate, and the semiconductor layer being on the buried insulating layer; a gate stack on the semiconductor layer; a source region and a drain region, which is in the semiconductor layer and on opposite sides of the gate stack; and a channel region, which is in the semiconductor layer and sandwiched by the source region and the drain region, wherein the MOSFET further comprises a back gate, the back gate being located in the semiconductor substrate and having a first doped region in a lower portion of the back gate and a second doped region in an upper portion of the back gate. In one embodiment, the MOSFET further comprises an anti-doped region in the second implantation region of the back gate below the channel region. The type of dopants in a reverse ion implantation is opposite to the doping type of the back gate.

Preferably, the back gate may have a doping type the same as or opposite to the type of the MOSFET.

Preferably, the portion of the back gate, which is below the channel region may, have a doping concentration which decreases or increases gradually towards the center of the channel region.

Preferably, the back gate may have a doping concentration of about $1\times10^{17}$ cm$^{-3}$ to about $1\times10^{20}$ cm$^{-3}$.

Preferably, the back gate adjoins the buried insulating layer.

Preferably, the MOSFET may comprise an anti-doped region, which is below the channel region and is in the second doped region of the back gate.

Preferably, the anti-doped region may have a doping type the same as or opposite to the type of the MOSFET.

Preferably, the anti-doped region may have a doping concentration smaller than the doping concentration of the back gate.

Preferably, the doping concentration of the anti-doped region may be about $1\times10^{15}$ cm$^{-3}$ to about $1\times10^{18}$ cm$^{-3}$.

Preferably, the MOSFET may further comprise shallow a trench isolation which separates the MOSFET from neighboring MOSFETs and has a depth larger than the depth of the back gate.

According to another aspect of the present disclosure, there is provided a method for manufacturing a MOSFET, comprising: providing an SOI wafer comprising a semiconductor substrate, a buried insulating layer, and a semiconductor layer, the buried insulating layer being on the semiconductor substrate, and the semiconductor layer being on the buried insulating layer; performing a first back gate ion implantation which is a deep ion implantation, so as to form a first doped region of the back gate in the semiconductor substrate; forming a dummy gate on the semiconductor layer; performing a second back gate ion implantation which is a shallow ion implantation, so as to form a second doped region of the back gate in the semiconductor substrate; performing a source/drain ion implantation to form a source region and a drain region in the semiconductor layer; removing the dummy gate to form a gate opening; performing a reverse ion implantation through the gate opening to form an anti-doped region in the second doped region of the back gate; and forming a gate stack in the gate opening. In one embodiment, the type of dopants in the first back gate ion implantation is the same as the type of dopants in the second back gate ion implantation, and the type of dopants in the reverse ion implantation is opposite to the type of dopants in the first back gate ion implantation and the second back gate ion implantation of the back gate.

Preferably, the implantation dose used in the first back gate ion implantation may be about $1 \times 10^{13}$ cm$^{-2}$ to about $1 \times 10^{15}$ cm$^{-2}$.

Preferably, the implantation dose used in the second back gate ion implantation may be about $1 \times 10^{13}$ cm$^{-2}$ to about $1 \times 10^{15}$ cm$^{-2}$.

Preferably, in the second back gate ion implantation, ions may be implanted in a direction perpendicular to the main surface of the SOI wafer such that the portion of the semiconductor substrate under the dummy gate has a doping concentration less than the doping concentration of the other portions of the semiconductor substrate.

Preferably, in the second back gate ion implantation, ions may be implanted in a tilt angle with respect to the main surface of the SOI wafer such that the portion of the semiconductor substrate under the dummy gate has a doping concentration larger than the doping concentration of the other portions of the semiconductor substrate.

Preferably, the type of dopants in the first back gate ion implantation may be the same as the type of dopants in the second back gate ion implantation.

Preferably, the type of dopants in the first back gate ion implantation and in the second back gate ion implantation may be the same as or opposite to the type of the MOSFET.

Preferably, sidewall spacers are formed on inner walls of the gate opening to reduce the width of the gate opening, and the reverse ion implantation may be performed through the gate opening having a reduced width. The reverse ion implantation is performed in a self-aligned manner.

Preferably, the implantation dose used in the reverse ion implantation may be about $1 \times 10^{13}$ cm$^{-2}$ to about $1 \times 10^{15}$ cm$^{-2}$.

Preferably, the type of dopants in the reverse ion implantation is the same as or opposite to the type of the MOSFET.

Preferably, the type of dopants in the reverse ion implantation may be opposite to the type of dopants in the first back gate ion implantation and the second back gate ion implantation of the back gate.

Preferably, the method may further comprise forming a shallow trench isolation which separates the MOSFET from neighboring MOSFETs and has a depth larger than the depth of the back gate.

The MOSFET according to the present disclosure comprises the back gate formed in the semiconductor substrate. When a bias voltage is applied to the back gate, the resultant electrical field goes through the buried insulating layer and is applied to the channel region. Thus, the back gate can have an effect of adjusting the threshold voltage, either increasing the threshold voltage or lowering the threshold voltage, depending on the doping type of the back gate.

In a preferable embodiment of the MOSFET, the anti-doped region is formed in the back gate below the channel region. The anti-doped region has an effect of locally decreasing a doping concentration of the back gate, which avoids excessive adjustment of the threshold voltage, i.e. an excessively high threshold voltage or an excessively low threshold voltage.

In a preferable embodiment of the MOSFET, the anti-doped region is formed in a MOSFET having a large gate length, but not formed in a MOSFET having a small gate length. Or, the anti-doped region in the MOSFET having a small gate length has a doping concentration higher than that of the anti-doped region in the MOSFET having a large gate length. Therefore, the threshold voltage of the semiconductor device having a small channel length may be adjusted in a way different from the semiconductor device having a large gate length. For example, the adjustment of the back gate in the semiconductor device having a large gate length may be completely suppressed by the anti-doped region. On the other hand, the anti-doped region may not be formed in the semiconductor device having a small gate length, where the back gate still has the effect of suppressing the short channel effects and increasing the threshold voltage.

Moreover, a plurality of MOSFETs on a semiconductor substrate may be provided with a common back gate and a common contact for the back gate to make the footprint smaller than that of the MOSFETs with respective back gates and respective contacts for the back gates.

DETAILED DESCRIPTION

Exemplary embodiments of the present disclosure will be described in more details below with reference to the accompanying drawings. For the sake of clarity, various components in the attached drawings are not drawn to scale.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including all of the layers and regions having been formed.

According to one preferable embodiment of the present disclosure, the steps shown in FIGS. 1 to 11 are performed for manufacturing a MOSFET.

Figure 1:
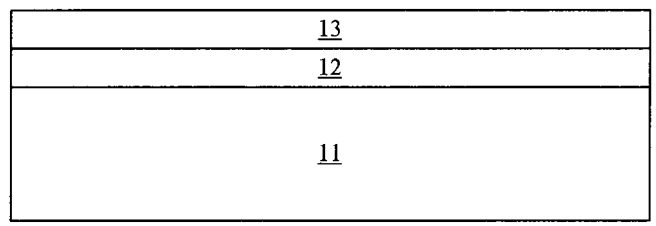
FIGS. 1-11 schematically show cross-sectional views in various stages of a method for manufacturing a MOSFET according to the present disclosure, respectively.

As shown in FIG. 1, an ordinary SOI wafer is used as an initial structure of the semiconductor substrate. The SOI wafer comprises, in a down-top fashion, a semiconductor substrate 11, a buried insulating layer 12, and a semiconductor layer 13. The semiconductor layer 13 may have a thickness of about 5 nm to about 20 nm, such as 10 nm or 15 nm. Moreover, the buried insulating layer 12 may have a thickness of about 5 nm to about 30 nm, such as 10 nm, 15 nm, 20 nm or 25 nm.

A portion of the semiconductor substrate 11 will be used as a back gate for the MOSFET. The semiconductor substrate 11 may be made of bulk silicon, Group IV semiconductor materials, (such as SiGe or Ge), or Group III-V semiconductor materials (such as GaAs).

The buried insulating layer 12 may be one of a buried oxide layer, a buried oxynitride layer, and any other buried insulating layer.

The semiconductor layer 13 will be used for providing a source region, a drain region, and a channel region of the MOSFET. The semiconductor layer 13 may be made of a semiconductor material selected from the group consisting of group-IV semiconductors (such as Si, Ge or SiGe) and group III-V compound semiconductors (such as GaAs). In the present embodiment, the semiconductor layer 13 may be monocrystalline silicon or SiGe.

The process for providing an SOI wafer is known in the art. For example, a SmartCut™ process (referred to as "Smart Cut" or "Smart Strip") can be used for this purpose. The SmartCut™ process comprises the steps of bonding two wafers with each other, each of which has a surface oxide layer formed by thermal oxidation or deposition, and one of which is subjected to hydrogen implantation so as to form a hydrogen doped region at a predetermined depth in the silicon body below the surface oxide layer. Then, under a condition of an increased pressure and an increased temperature, the hydrogen doped region is converted to a layer having micro-cavities for subsequent separation. Thus, it is easy to separate the two portions of the wafers on two sides of the layer having micro-cavities. The wafer including the surface oxide layer bonded to the semiconductor substrate is used as an SOI wafer. By controlling process parameters in the thermal oxidation or in the deposition, the thickness of the buried insulating layer in the SOI wafer can be changed. By controlling implantation energy during the hydrogen implantation, the thickness of the semiconductor layer in the SOI wafer can be varied.

Figure 2:
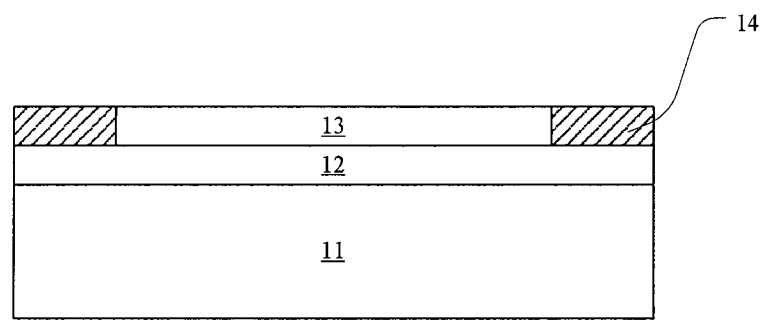

Trenches are then formed by patterning the semiconductor layer 13. An insulating material fills the trenches so as to form shallow trench isolations (STI) 14 for defining an active region of the MOSFET, as shown in FIG. 2.

The patterning process may involve the following steps: forming a photoresist mask having a pattern therein on the semiconductor layer 13, by a conventional lithographical process including exposure and development steps; removing exposed portions of the semiconductor layer 13 by dry etching, such as ion beam milling, plasma etching, reactive ion etching, and laser ablation, or wet etching using a solution of etchant, the etching stopping at the top of the buried insulating layer 12; and then, removing the photoresist mask by ashing or by dissolution in a solvent.

Figure 3:
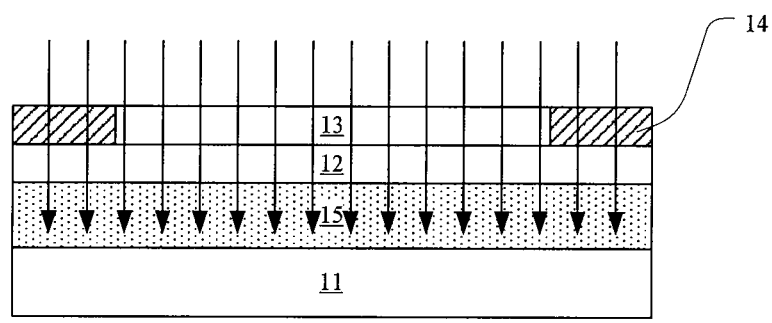

Next, a first back gate ion implantation is performed on the semiconductor substrate 11, as shown in FIG. 3. Because the total thickness of the semiconductor layer 13 and the buried insulating layer 12 is only about 10-50 nm, the implanted ions easily penetrate these layers and reach the semiconductor substrate 11. The depth of the implantation is controlled by changing implantation energy and dose, so that the implanted ions are distributed mainly in the semiconductor substrate 11.

The first back gate ion implantation for the back gate is a deep ion implantation such that the obtained first doped region 15 occupies at least a lower portion of the back gate to be formed. The first doped region 15 may be located in an upper portion of the semiconductor substrate 11. The first doped region 15 may adjoin the buried insulating layer 12, Or alternatively it may be separated from the buried insulating layer 12 at a certain distance and not adjoin it directly (not shown).

Dopants in the first back gate ion implantation for the back gate may be either of N-type or of P-type. The type of the dopants may be opposite to the type of the MOSFET in order to increase the threshold voltage of the MOSFET, i.e. P-type for an N-type MOSFET, or N-type for a P-type MOSFET. The type of the dopants may be the same as the type of the MOSFET in order to decrease the threshold voltage of the MOSFET.

When P-type dopants are used, boron (B or BF2), Indium (In), or a combination of boron and Indium may be used. When N-type dopants are used, arsenic (As), phosphor (P), or a combination of arsenic and phosphor may be used.

In the first back gate ion implantation, the dose of the dopants can be determined according to technological level and product requirements, and may be, for example, about $1 \times 10^{13}$ cm$^{-2}$ to about $1 \times 10^{15}$ cm$^{-2}$. Consequently, the first impantation region 15 has a doping concentration of about $1 \times 10^{17}$ cm$^{-3}$ to about $1 \times 10^{20}$ cm$^{-3}$.

Figure 4:
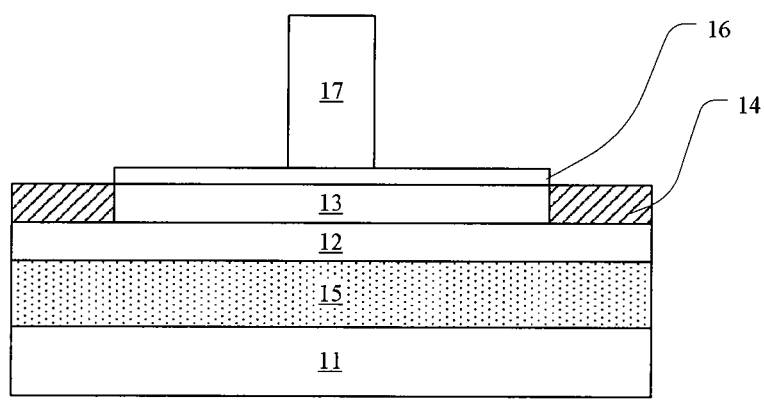

Next, a dummy gate stack is formed on the semiconductor layer 13, as shown by FIG. 4. The dummy gate stack may comprise a gate dielectric layer 16 and a dummy gate 17. The gate dielectric layer 16 may have a thickness of about 1 nm to about 4 nm, and the dummy gate 16 may have a thickness of about 30 nm to about 100 nm. In an alternative embodiment, the gate dielectric layer 16 may not be included in the dummy gate stack. Deposition processes and patterning processes for forming the gate stack are known in the art, in which the dummy gate 17 is typically patterned into a stripe shape.

The gate dielectric layer 16 may be made of one or more materials selected from a group consisting of oxides, oxynitrides, and high-K materials (such as, one or more materials selected from a group consisting of HfO$_2$, HfSiO, HfSiON, HfTaO, HfTiO, HfZrO, Al$_2$O$_3$, La$_2$O$_3$, ZrO$_2$ and LaAlO). The dummy gate 17 may be of a metal layer, a doped polysilicon layer, or a stack of a metal layer and a doped polysilicon layer. Alternatively, the dummy gate 16 may comprise an insulating material, such as silicon oxide, silicon oxynitride, or silicon nitride.

The channel region comprises the portion (not shown) of the semiconductor layer 13 below the gate stack, and is preferably undoped, or it is self-doped or doped in a previous independent ion implantation process.

Figure 5:
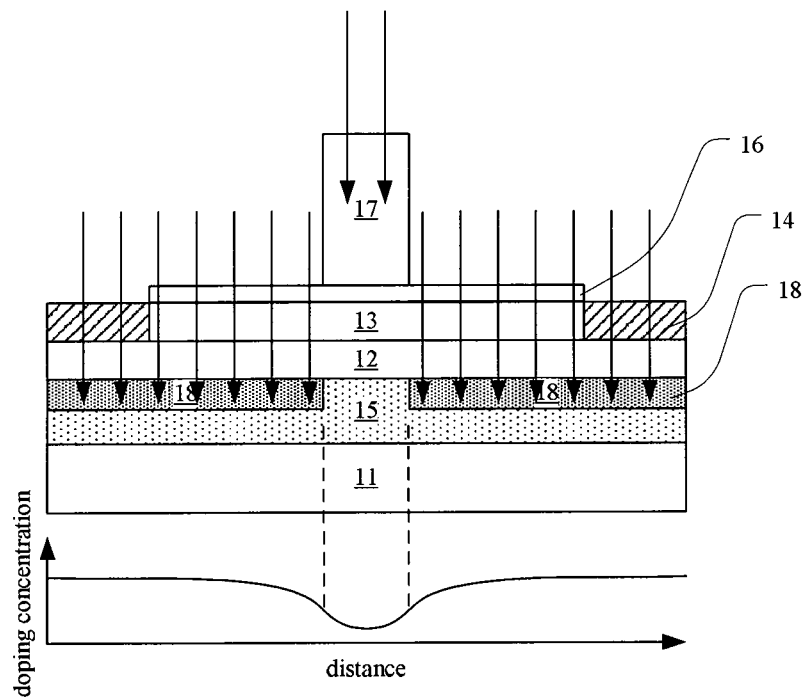

Next, a second back gate ion implantation is performed on the semiconductor substrate 11, as shown in FIG. 5. Because the total thickness of the gate dielectric layer 16, the semiconductor layer 13 and the buried insulating layer 12 is only about 10-50 nm, the implanted ions easily penetrate these layers and reach the semiconductor substrate 11. The depth of the implantation is controlled by changing implantation energy and dose, so that the implanted ions are distributed mainly in the semiconductor substrate 11.

Compared with the first back gate ion implantation, the second back gate ion implantation is a shallow ion implantation such that the obtained second doped region 18 occupies at least an upper portion of the back gate to be formed. The second doped region 18 may be located above the first doped region 15 or may occupy an upper portion of the first doped region 15. Furthermore, the second doped region 18 may be located in an upper portion of the semiconductor substrate 11 and adjoin the buried insulating layer 12. Alternatively, the second doped region 18 may be separated from the buried insulating layer 12 at a certain distance and not adjoin it directly (not shown).

The first doped region 15 and the second doped region 18 together form a back gate having an uneven doping concentration.

Due to the blocking by the dummy gate 17, the doping profile is influenced by the ion implantation angle. If the ions are implanted in a direction perpendicular to the main surface of the SOI wafer in the second back gate ion implantation, the portion of the semiconductor substrate 11 under the dummy gate 17 will have a doping concentration less than that of the other portions of the semiconductor substrate 11, as shown in FIG. 5. If the ions are implanted in a tilt angle with respect to the main surface of the SOI wafer in the second back gate ion implantation, the portion of the semiconductor substrate under the dummy gate will have a doping concentration larger than that of the other portions of the semiconductor substrate (not shown).

The type of the dopants in the second back gate ion implantation may be the same as that of the dopant in the first back gate ion implantation. The dose of the dopant can be determined according to technological level and product requirements, and may be, for example, about $1 \times 10^{13}$ cm$^{-2}$ to about $1 \times 10^{15}$ cm$^{-2}$. In such a case, the portion of the back gate not below the channel region may have a doping concentration of about $1 \times 10^{17}$ cm$^{-3}$ to about $1 \times 10^{21}$ cm$^{-3}$. The portion of the back gate below the channel region may have a doping concentration of about $1 \times 10^{15}$ cm$^{-3}$ to about $1 \times 10^{18}$ cm$^{-3}$.

Preferably, a rapid anneal, which is also known as spike anneal, may be performed after the second back gate ion implantation, for example, by using laser, electron beam, or infrared radiation, so as to remedy damages in the lattice and activate the implanted dopants. Due to the ion implantation anneal, the implanted dopants diffuse again and form a doping profile extending laterally towards the portion under the dummy gate 17.

Due to the lateral diffusion of the dopants, the doping concentration of the back gate below the channel region decreases towards the center of the channel region and reaches to a minimum value at the center of the channel region (see a doping profile in a cross section through the second doped region 15 as shown in FIG. 5).

Figure 6:
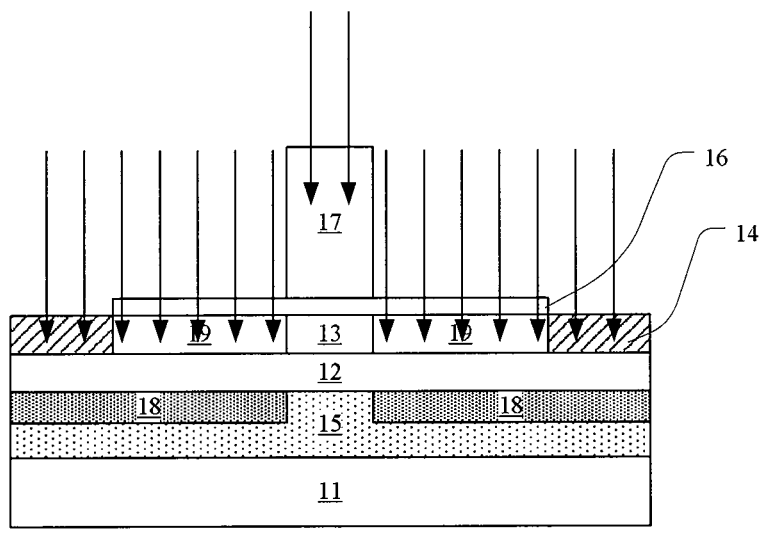

A standard complementary metal-oxide-semiconductor (CMOS) process continues, including performing an ion implantation for source/drain regions and forming source/drain regions 19 in the semiconductor layer 13, as shown in FIG. 6.

Preferably, a rapid anneal is performed after the second back gate ion implantation, which is also known as spike anneal, for example, by using laser, electron beam or infrared radiation, so as to remedy damages in the lattice and activate the implanted dopants.

Figure 7:
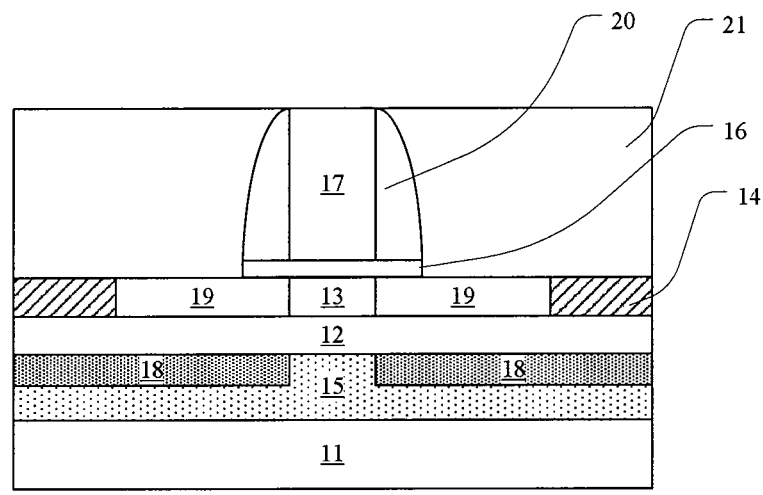

Sidewall spacers 20 are then formed on opposite sides of the dummy gate 17. An interlayer dielectric layer 21 is formed on the semiconductor structure. A portion of the interlayer dielectric layer 21 is removed by Chemical Mechanical Planarization (CMP) which stops at the top of the dummy gate 17 to provide a flat surface of the semiconductor structure, as shown in FIG. 7.

Next, the dummy gate 17 is selectively removed to form a gate opening having a width L, by wet etching or dry etching, with the interlayer dielectric layer 21 as a mask. The portion of the gate dielectric layer 16 under the dummy gate 17 is thus exposed. Alternatively, the gate dielectric layer 16 may also be removed. In a case that the gate dielectric layer 16 is kept, the gate dielectric layer 16 will be used in a subsequent ion implantation process as a protection layer for the ion implantation to reduce damages to the semiconductor substrate 11 due to the ion implantation operation.

Figure 8:
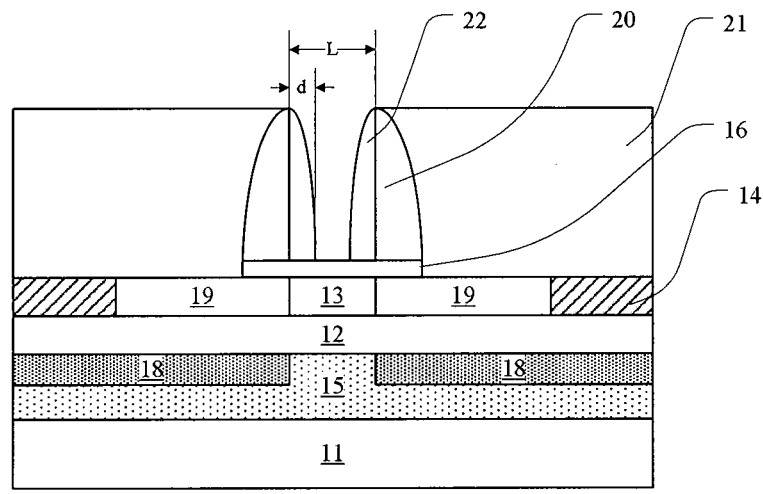

Optionally, an auxiliary mask layer is formed on the whole surface of the semiconductor structure. The auxiliary mask layer may be an amorphous silicon layer having a thickness d of about 5 nm to about 15 nm, and may be formed at a temperature of about 300° C. to about 400° C. For a semiconductor device having a large gate length (relatively, the gate length L>2 d), the amorphous silicon layer covers the sidewalls and the bottom of the gate opening. Next, an anisotropic etching (for example, RIE) may be performed on the amorphous silicon layer without any other mask. Not only the portion of the amorphous silicon outside of the gate opening is removed, but also the portion of the amorphous silicon at the bottom of the gate opening is removed. The remaining portions of the amorphous silicon layer on the inner wall of the gate opening form sidewall spacers 22. The sidewall spacers 22 reduce a width of the gate opening. The reduced width I of the gate opening satisfies the condition I=L−2 d approximately, as shown in FIG. 8. For a semiconductor device having a small gate length (relatively, the gate length L<2 d), the auxiliary mask layer has a thickness d and thus fills up the gate opening (note shown).

Figure 9:
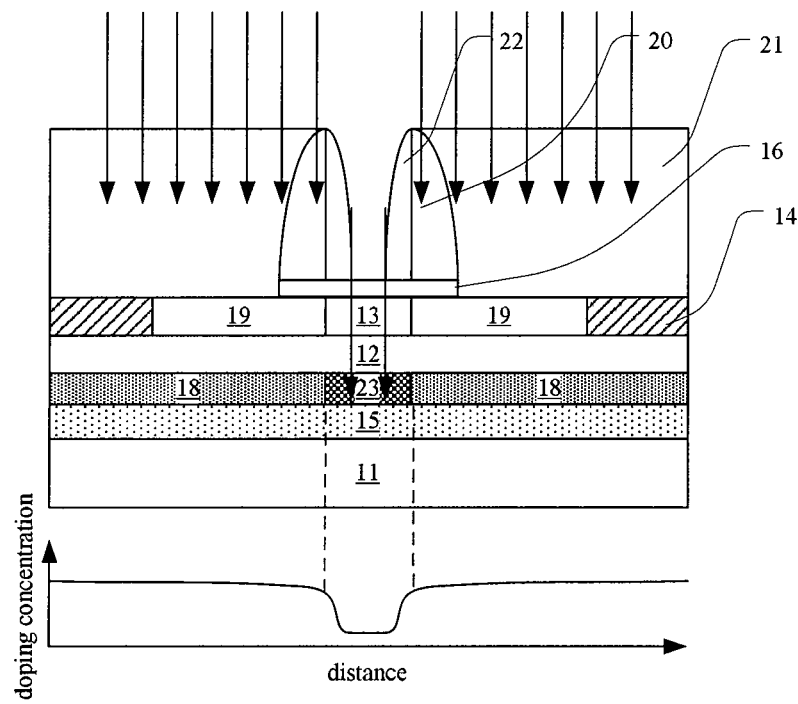

Next, a reverse ion implantation is performed with the gate opening as a window to form an anti-doped region 23 in the semiconductor substrate 11, as shown by FIG. 9.

The type of the dopants in the reverse ion implantation is opposite to that of the dopants in the first back gate ion implantation shown in FIG. 3 and the second back gate ion implantation shown in FIG. 5. By controlling power and dose used in the ion implantation, the reverse ion implantation may be performed at a depth approximately equal to that for the second back gate ion implantation. In this embodiment, the dose used in the reverse ion implantation is about $1 \times 10^{13}$ cm$^{-2}$ to about $1 \times 10^{15}$ cm$^{-2}$. As a result, the anti-doped region 23 is located below the channel region, has a depth approximately equal to that of the second doped region 18, and is sandwiched between two portions of the second doped region 18. Note that the anti-doped region 23 extends downwards but does not penetrate the first doped region 15.

After forming the revere doped region 23, an effective doping concentration of the portion of the back gate below the channel region decreases distinctly because the type of the dopants in the reverse ion implantation is opposite to that of the dopants in the first back gate ion implantation and the second back gate ion implantation. In other words, the region of the back gate overlapping with the anti-doped region 23 is still doped to be P-type for an N-type semiconductor device, or is still doped to be N-type for a P-type semiconductor device. Nevertheless, it has a doping concentration smaller than that in the original back gate below the channel region.

Alternatively, as required in device design, the region of the back gate overlapping with the anti-doped region 23 may have an inverse doping type. It is doped to be N-type for an N-type semiconductor device, or is doped to be P-type for a P-type semiconductor device.

Therefore, the anti-doped region 23 is used for adjusting a doping profile of the portion of the back gate below the channel region, which facilitates flexibly adjusting the threshold voltage of the semiconductor device. The anti-doped region 23 is formed in a self-aligned manner and is located just below the channel region and adjusts the doping profile of the back gate.

In this embodiment, the doping type of the first doped region 15 and the second doped region 18 of the back gate is opposite to the type of the MOSFET, in order to increase the threshold voltage of the MOSFET. The doping type of the anti-doped region 23 is the same as that of the first doped region 15 and the second doped region 18 of the back gate. However, the anti-doped region 23 has a doping concentration smaller than that of the first doped region 15 and the second doped region 18 of the back gate. For example, the first doped region 15 and the second doped region 18 may each have a doping concentration of about $1 \times 10^{17}$ cm$^{-3}$ to about $1 \times 10^{20}$ cm$^{-3}$, and the anti-doped region 23 may have a doping concentration of about $1 \times 10^{15}$ cm$^{-3}$ to about $1 \times 10^{15}$ cm$^{-3}$.

In a case that the auxiliary mask layer is formed in the above optional step, the anti-doped region 23 is formed through the gate opening having a reduced width, only for the semiconductor device having a large gate length. However, the auxiliary mask layer blocks implanted ions in the semiconductor having a small gate length. The implanted ions either cannot penetrate the auxiliary mask layer, as a result of which no an anti-doped region is formed in the portion of the back gate below the channel region, or partially penetrate the auxiliary mask layer. In the latter case, the effective doping concentration is approximately equal to an initial doping concentration of the second doped region minus the penetrated portion of the ions in the reverse ion implantation.

Consequently, the doping concentration of the anti-doped region 23 in the semiconductor device having a small gate length is higher than that in the semiconductor device having a large gate length, which facilitates suppressing the short channel effects. Thus, the threshold voltage of the semiconductor device having a small channel length is adjusted in a way different from the semiconductor device having a large gate length.

Moreover, in an alternative embodiment, the anti-doped region 23 may be located inside the back gate, at a distance from the channel region. Such an arrangement has a beneficial effect of minimizing possibility of performance deterioration of the semiconductor device, because fewer implanted ions remain in the channel region in the reverse ion implantation.

Next, an anneal is performed for a short time, for example, by using laser, electron beam or infrared radiation, so as to remedy damages in the lattice and activate the implanted dopant in the anti-doped region 23. Due to the anneal for the ion implantation, the implanted dopant diffuses again. However, the anti-doped region 23 includes the dopant of opposite type, and thus has a concentration of the dopant changing abruptly at its interface with the back gate. It provides an abrupt change in a doping profile (see a doping profile in a cross section through the second doped region 15 as shown in FIG. 9).

A short channel (not shown) is formed in the portion of the semiconductor layer 13 above the anti-doped region 23. Compared with a typical long channel, the short channel receives a smaller dose of dopants.

Next, the sidewall spacers 22 are selectively removed by wet etching. Next, a new high-K dielectric layer 24 is formed at the bottom and on an inner wall of the gate opening. The high-K dielectric layer 24 may be made of one of $HfO_2$, HfSiO, HfSiON, HfTaO, HfTiO, HfZrO, $Al_2O_3$, $La_2O_3$, $ZrO_2$ and LaAlO, or any combination thereof. The high-K dielectric layer 24 may have a thickness of about 1 nm to about 3 nm.

A replacement gate material (for example, the above metal forming the dummy gate 17) is then deposited on the whole surface of the semiconductor structure. The replacement gate material should have a thickness sufficient for filling up the gate opening.

Figure 10:
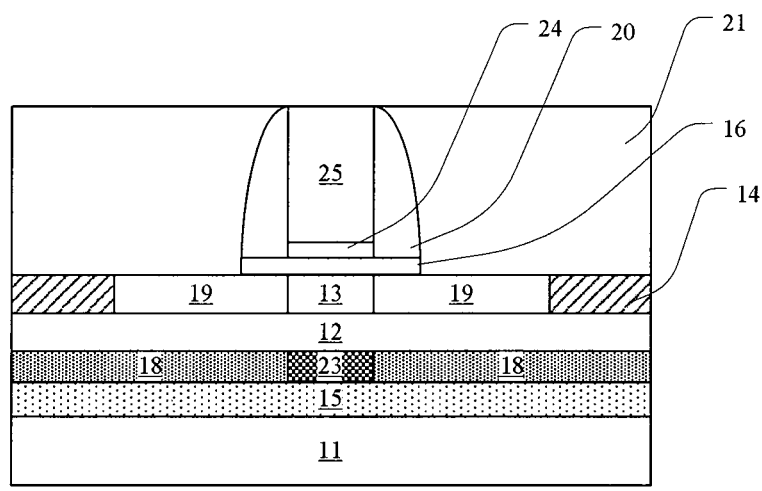

Next, CMP is performed on the replacement gate material to obtain a flat structure surface. In the present application, the term "flat", "planar" or "flush" means that a height difference between any two points in a plane is within a process tolerance. During CMP, the previously formed interlayer dielectric layer 21 is used as a stop layer such that the portion of the replacement gate material outside the gate opening can be removed completely. The remaining portion of the replacement gate material in the gate opening forms a replacement gate 25 as shown in FIG. 10.

Preferably, the gate dielectric layer 16 may also be removed after the sidewall spacers 22 are removed in the above steps, if required.

Further preferably, after the new high-K dielectric layer 24 is formed, a threshold adjustment layer (for example, TiN, TaN, TiAlN, and TaAlN) is formed in the gate opening before the replacement gate material.

Figure 11:
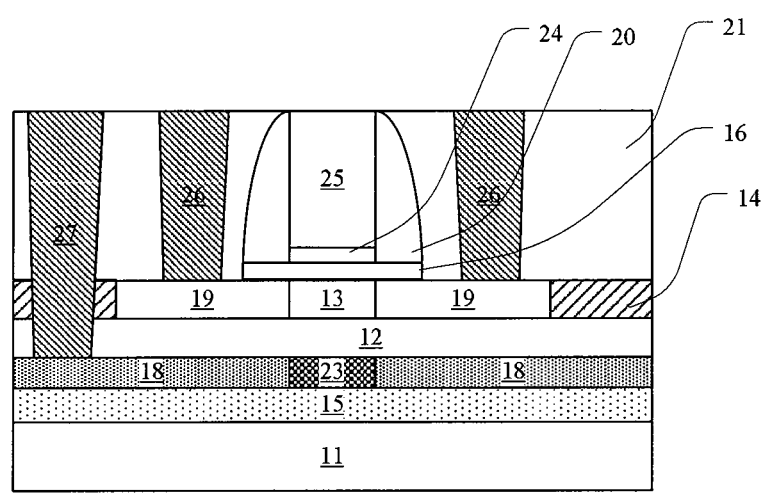

Next, via holes are formed through the interlayer dielectric layer 21 to reach the source/drain regions 19, and are formed through the interlayer dielectric layer 21, the shallow trench isolation 14 and the buried insulating layer 12 to reach the second doped region of the back gate 18. Next, the via holes are filled with metal to form conductive vias 26, which are electrically connected to the source/drain regions 19, and to form conductive vias 27, which are electrically connected to the back gate, as shown in FIG. 11. Note that when MOSFET is separated from neighboring MOSFETs by shallow trench isolations, the shallow trench isolations may have a depth larger than the depth of the back gate.

The resultant MOSFET is shown in FIG. 11.

The structures, materials and methods for various parts in the embodiment of the MOSFET are similar to those having been described for the embodiments of the method for manufacturing the MOSFET. Detailed description is omitted here for simplicity.

In the MOSFET, when a bias voltage is applied to the back gate, the back gate region and the anti-doped region provide two different bias electrical fields. The electric characteristic may be controlled to compensate the short channel effects in the MOSFET.

While the disclosure has been described with reference to specific embodiments, the description is illustrative of the disclosure. The description is not to be considered as limiting the disclosure. The description is not to be considered as limiting the disclosure.

We claim:

1. A Metal Oxide Semiconductor Field Effect Transistor (MOSFET), comprising:
    a Semiconductor on Insulator (SOI) wafer, which comprises a semiconductor substrate, a buried insulating layer, and a semiconductor layer, the buried insulating layer being on the semiconductor substrate, and the semiconductor layer being on the buried insulating layer;
    a gate stack on the semiconductor layer;
    a source region and a drain region, which are in the semiconductor layer and on opposite sides of the gate stack; and
    a channel region, which is in the semiconductor layer and sandwiched by the source region and the drain region,
    wherein the MOSFET further comprises a back gate located in the semiconductor substrate, the back gate having a first doped region in a lower portion of the back gate with a first doping type, a second doped region in an upper portion of the back gate with the first doping type, and an anti-doped region below the channel region and in the second doped region with a second doping type, wherein the doping concentration of the second doped region of the back gate decreases gradually in a direction from either the source region or the drain region towards the center of the channel region, and wherein the anti-doped region has a doping concentration lower than a doping concentration of the second doped region of the back gate.

2. The MOSFET according to claim 1, wherein the first doping type of the back gate is the same as or opposite to a doping type of the MOSFET.

3. The MOSFET according to claim 1, wherein the doping concentration of the back gate is about $1\times10^{17}$ $cm^{-3}$ to about $1\times10^{20}$ $cm^{-3}$.

4. The MOSFET according to claim 1, wherein the back gate adjoins the buried insulating layer.

5. The MOSFET according to claim 1, wherein the second doping type is opposite to the first doping type.

6. The MOSFET according to claim 1, wherein the doping concentration of the anti-doped region is about $1\times10^{15}$ $cm^{-3}$ to about $1\times10^{18}$ $cm^{-3}$.

* * * * *